(12) United States Patent
Watanabe

(10) Patent No.: US 8,962,457 B2
(45) Date of Patent: Feb. 24, 2015

(54) INSULATED GATE TYPE TRANSISTOR AND DISPLAY DEVICE

(75) Inventor: Tomohiro Watanabe, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 346 days.

(21) Appl. No.: 12/597,219

(22) PCT Filed: Apr. 30, 2008

(86) PCT No.: PCT/JP2008/058590
§ 371 (c)(1),
(2), (4) Date: Oct. 23, 2009

(87) PCT Pub. No.: WO2008/143021
PCT Pub. Date: Nov. 27, 2008

(65) Prior Publication Data
US 2010/0078633 A1   Apr. 1, 2010

(30) Foreign Application Priority Data

May 11, 2007   (JP) .................. 2007-126860

(51) Int. Cl.
*H01L 21/20*   (2006.01)
*H01L 29/786*   (2006.01)

(52) U.S. Cl.
CPC ....................... *H01L 29/7869* (2013.01)
USPC ............. 438/479; 438/104; 438/197; 257/43; 257/288; 257/E29.08

(58) Field of Classification Search
USPC ....... 257/43, 288, E29.08; 438/104, 197, 479
See application file for complete search history.

(56) References Cited

U.S. PATENT DOCUMENTS

| | | | |
|---|---|---|---|
| 5,528,032 A | 6/1996 | Uchiyama | 250/288 |
| 2006/0132461 A1* | 6/2006 | Furukawa et al. | 345/173 |
| 2006/0244107 A1 | 11/2006 | Sugihara et al. | 257/646 |
| 2006/0278954 A1* | 12/2006 | Izumi | 257/532 |
| 2007/0052025 A1* | 3/2007 | Yabuta | 257/347 |

FOREIGN PATENT DOCUMENTS

| | | |
|---|---|---|
| EP | 1 536 452 A1 | 6/2005 |
| JP | 06-291318 A | 10/1994 |
| JP | 2002-076356 A | 3/2002 |
| JP | 2004-063978 A | 2/2004 |
| JP | 2004-134694 | 4/2004 |
| JP | 2007-073697 A | 3/2007 |
| JP | 2007-142195 A | 6/2007 |
| JP | 2007-311404 A | 11/2007 |

OTHER PUBLICATIONS

J. Nishii et al., "High Mobility Thin Film Transistors with Transparent ZnO Channels," Jpn. J. Appl. Phys., vol. 42, part 2, No. 4A, Apr. 1, 2003, pp. L347-L349.

(Continued)

*Primary Examiner* — Zandra Smith
*Assistant Examiner* — Jamie C Niesz
(74) *Attorney, Agent, or Firm* — Fitzpatrick, Cella, Harper & Scinto

(57) ABSTRACT

A transistor comprises an active layer of an oxide containing at least one element selected from In, Ga and Zn. The active layer is formed such that a desorption gas monitored as a water molecule by a temperature programmed desorption analysis is $1.4/nm^3$ or less.

2 Claims, 5 Drawing Sheets

(56) References Cited

OTHER PUBLICATIONS

Office Action issued by JPO on Sep. 25, 2012 in counterpart Japanese Patent Application No. 2007-126860 (with translation).

Office Action issued Jul. 9, 2012, in counterpart Japanese Application No. 2007-126860, with translation.

H.D. Kim et al., "Oxide TFT as an Emerging Technology for Next Generation Display", *IMID/IDMC/ASIA Display* '08 Digest, pp. 119-122 (2008).

\* cited by examiner

INSULATED GATE TYPE TRANSISTOR AND DISPLAY DEVICE

TECHNICAL FIELD

The present invention relates to an insulated gate type transistor and a display device, and in particular, to an insulated gate type transistor including an active layer of an oxide containing at least one of In, Ga and Zn and a display device using the transistor.

BACKGROUND ART

In recent years, a system using a transparent conductive oxide as a main component such as, for example, zinc oxide (ZnO) has been actively developed as a material for the active layer of a field effect transistor (Japanese Patent Application Laid-Open No. 2002-76356).

Zinc oxide (ZnO) is allowed to be thin-filmed at a comparatively low temperature. The development of a flexible transistor using a flexible substrate such as polymeric substrate has been attempted.

For example, Japanese Journal of Applied Physics, Volume 42, No. 4A (2003) pp. L347 to L349 discloses that a CaHfOx buffer layer is used to obtain a good TFT characteristic at a substrate temperature of 150° C. However, it does not mention whether deposition is made at a room temperature to obtain a good TFT characteristic.

Since ZnO tends to create the vacancy of oxygen and is sensitive to the atmosphere (or, there occur changes in its characteristic due to the influence of the atmosphere), a protective layer is provided to separate an active layer from the atmosphere according to, for example, U.S. Patent Application Publication No. 2006/244107A1.

The above patent publication describes that the protective layer may be provided with a region so that electric charges (also called movable electric charges) in the active layer move are separated from the atmosphere so as not to be influenced by the atmosphere.

For this reason, the protective layer is formed to suppress the influence of the atmosphere on the active layer after a semiconductor device has been produced, but not to suppress the absorption of moisture into the active layer during deposition.

The inventors made a study of a practical application of an insulated gate type transistor using an oxide semiconductor in its active layer by means of the sputtering method, and the inventors' study has revealed that even insulated gate type transistors produced by the same apparatus and under the same conditions differ in mobility and on-off ratio depending on the time when they were produced.

The present invention has for its object to provide an insulated gate type transistor which is high in mobility and good in on-off ratio, and a display device using the same.

DISCLOSURE OF THE INVENTION

The inventors made various analyses to obtain an insulated gate type transistor using an oxide semiconductor in its active layer which is high in mobility and good in on-off ratio and found that one of the factors affecting variation in mobility and on-off ratio involved moisture contained in the active layer.

In general, oxide is high in polarizability and tends to absorb more moisture than polycrystalline Si or amorphous Si. In addition, when a transistor is formed of a polymeric material substrate, all components need to be deposited at a low temperature. The deposition at a low temperature more easily absorbs moisture which is desorbed from the inner wall of a depositing chamber during deposition than does a deposition at a high temperature.

The inventors focused attention on correlation of the amount of moisture contained in the active layer formed of an oxide semiconductor with TFT characteristics to devote themselves to conducting a study, thus completing the present invention.

That is to say, a transistor (typically, an insulated gate type transistor) according to the present invention is characterized by including an active layer of an oxide containing at least one element selected from In, Ga and Zn, and the active layer is formed such that a desorption gas monitored as a water molecule by a Temperature Programmed Desorption (TPD: referred to as "TDS") analysis is $1.4/nm^3$ or less.

A manufacturing method of the insulated gate type transistor including an active layer of an oxide containing at least one element selected from In, Ga and Zn, according to the present invention, is characterized by including a step of forming the active layer such that, after forming the active layer, a desorption gas monitored as a water molecule by a TPD analysis is $1.4/nm^3$ or less.

In the transistor and the manufacturing method thereof according to the present invention, the active layer is desirably an oxide formed to contain In—Ga—Zn—O.

In the transistor and the manufacturing method thereof according to the present invention, the active layer is amorphous.

The term "amorphous" used herein refers to a structure which exhibits only a typical halo pattern but not a sharp diffraction peak in X-ray diffraction measurement or electron beam diffraction measurement under a transmission electron microscope (TEM). In addition, the term "amorphous" refers to a structure in which long-distance order structure is not observed under the TEM. An amorphous structure is basically homogeneous and does not have heterogeneous structures such as a grain boundary.

According to the present invention, there is provided an insulated gate type transistor with high mobility and good in on-off ratio, which includes the active layer formed such that a desorption gas monitored as a water molecule by a TPD analysis is $1.4/nm^3$ or less.

Further features of the present invention will become apparent from the following description of exemplary embodiments with reference to the attached drawings.

BEST MODE FOR CARRYING OUT THE INVENTION

Figure 1:
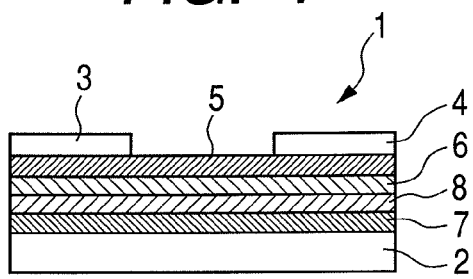
FIG. 1 is a cross-section illustrating the configuration of a bottom gate thin film transistor according to a first embodiment of the present invention.

An active layer of the transistor (typically, an insulated gate type transistor) of the present embodiment may be formed of an oxide containing at least one element selected from In, Ga and Zn. An oxide layer including, for example, In—Ga—Zn—O can be suitably used.

The active layer is caused to contain moisture to obtain an oxide semiconductor thin film which does not exhibit hysteresis, is stable in threshold voltage and has TFT characteristics good in reproducibility. In this case, the content of moisture is preferably $1.4/nm^3$ or less.

The transistor of the present embodiment most effectively operates when the active layer thereof is amorphous.

As a method of depositing each component member of the transistor, there are available a sputtering method, a vacuum vapor deposition method, an ion plating method, a dipping method, a CVD method, an MOCVD method and a PCVD method and the like. One particularly suitably used in the present invention is preferably the sputtering method which is used to perform deposition at a temperature of as low as 300° C. or less, homogeneous in the distribution of moisture in a film and suited for a large area deposition. When deposition is performed at a temperature of 300° C. or higher, a problem may occur in that the distribution of moisture in a film is liable to be inhomogeneous, the TFT characteristics become unstable and the reproducibility of characteristics is lowered.

In the present embodiment, as a method of controlling the content of moisture, there was used a decrease in water vapor partial pressure in the depositing chamber due to use and non-use of the load lock chamber of the sputtering apparatus and due to time course at the time of using it. In addition to the above method, there is available another method of causing a target to contain moisture in the sputtering method. In this case, it is preferable to lower the substrate temperature during deposition to 100° C. or less and more preferably to a room temperature of 50° C. or less. In this case, temperature is difficult to control, which may disperse the electric characteristic of a thin film, so that it is preferable to perform deposition at the substrate temperature of 300° C. or lower if required. The decrease in the power used allows the target to contain moisture.

As a method of causing the target to contain moisture after deposition, there are available, for example, methods of annealing in water vapor and implanting $H_2O$.

As a method of measuring the content of moisture, there is available a TPD method. In general, the desorption peak of moisture absorbed mainly on a surface is observed at a temperature of from several tens of degrees Celsius to approximately 200° C., measured by a thermocouple brought into contact with the substrate surface. Then, the desorption peak of moisture existing in a thin film is observed at a temperature of approximately 200° C. or more.

In the present embodiment, a water molecule desorbed from the active layer is considered to have reached equilibrium (completely desorbed) at a temperature of 600° C. based on the TPD analysis, so that a temperature range used in determination was taken as 50° C. to 600° C. In this case, temperature was measured by a thermocouple brought into contact with the substrate surface.

Whether or not the desorbed gaseous species is moisture can be determined at the time of a TPD analysis from the ionic strength of mass number (m/z) 18 corresponding to $H_3O^+$ being synchronously changed with that of mass number (m/z) 17 corresponding to $OH^+$.

As a method of measuring the content of moisture in the semiconductor layer when the sample size of the layer is minute or the layer is covered with an insulating film or a passivation film, there is available a secondary ion mass spectrometry (SIMS). The SIMS observes the content of moisture as $H^+$, $H_2O^-$, $OH^-$ and $H_3O^+$ and the like.

Also in the present embodiment, a transparent active layer is preferable. In this case, the use of transparent materials similar to the active layer in each composition member of the transistor makes the transistor transparent.

A flexible transistor can be formed such that the active layer is made amorphous, a flexible substrate such as a polymeric substrate is used in it and an amorphous material is used in each composition member of the transistor.

At least one of $Al_2O_3$, $SiO_2$, SiON, SiN and $Si_3N_4$, or one of multiple oxide and multiple oxynitride including at least one of $Al_2O_3$, $SiO_2$, SiON, SiN and $Si_3N_4$ is preferable as the insulating layer. It is also preferable to use as the insulating layer at least one of $Sc_2O_3$, $TiO_2$, ZnO, $Ga_2O_3$, SrO, $Y_2O_3$, $ZrO_2$, $In_2O_3$, SnO, BaO, $La_2O_3$, $Pr_2O_3$, $Gd_2O_3$, $Yb_2O_3$, $HfO_2$, $Ta_2O_3$, PbO and $Bi_2O_3$ which are high in relative dielectric constant.

As a substrate, there are available, for example, silica glass, Si substrate, and ceramics. For example, polyimide, polyester, other polymeric materials, glass, cloth, or paper may be used as flexible substrate. The present invention is particularly effective when deposition is performed at a temperature of 300° C. or lower due to the problem in the deterioration of the material of a substrate and difference in thermal expansion between the active layer and the insulating layer during deposition.

As an electrode, there are available Au, Ti, Ni, In, Sn, Zn, Cu or Ag, or alloys including at least one of them or oxide.

The element may be constructed to have the so-called "top gate structure" or "bottom gate structure" and each gate may be configured by top-contact type or bottom-contact type.

The embodiments according to the present invention are described with reference to the drawings. The following embodiments are merely exemplary, and the present invention is not limited to any of them.

First Embodiment

Figure 2:
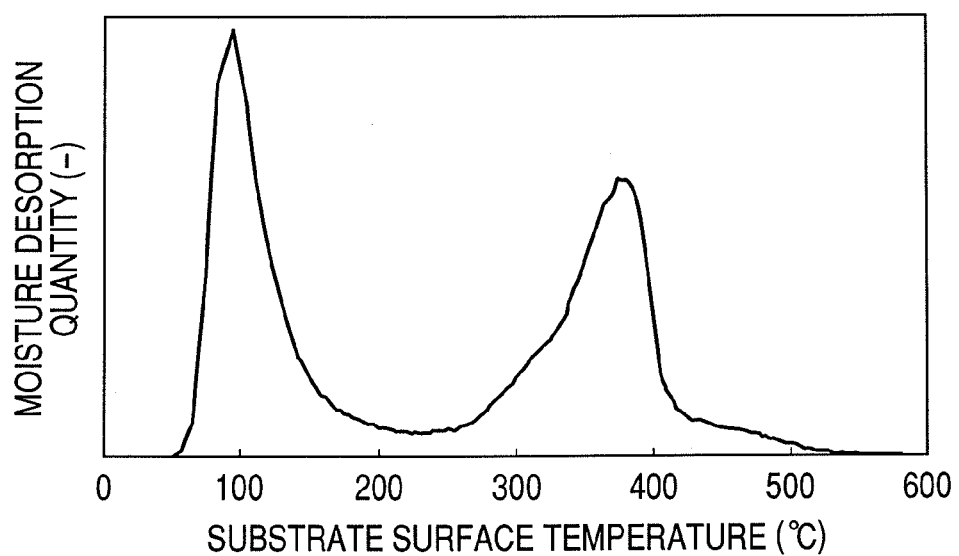
FIG. 2 is a chart illustrating results of TPD measurement on an active layer according to the first embodiment of the present invention.
Figure 3:
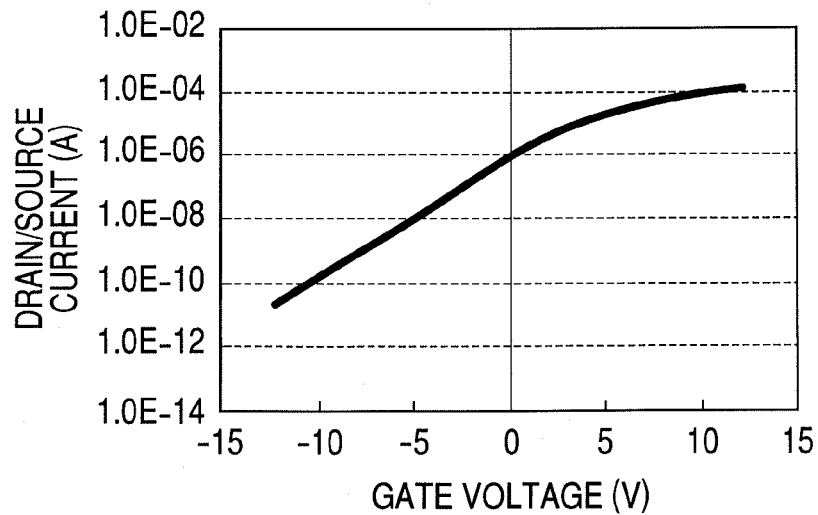
FIG. 3 is a chart illustrating the drain/source current with respect to the gate voltage of the bottom gate thin film transistor according to the first embodiment of the present invention.

The configuration and the manufacturing method of an insulated gate type transistor according to the first embodiment of the present invention are described below based on FIGS. 1, 2 and 3. FIG. 1 is a cross-section illustrating the configuration of a bottom gate thin film transistor according to the first embodiment of the present invention. FIG. 2 is a chart illustrating results of TPD measurement on an active layer according to the first embodiment of the present invention. FIG. 3 is a chart illustrating the drain/source current with respect to the gate voltage of the bottom gate thin film transistor according to the first embodiment of the present invention.

Single crystal Si was used as a substrate 2 and Ti and Au were used as gate electrodes 7 and 8 on the substrate and then deposited in that order by a vacuum vapor deposition method. The substrate temperature during deposition is approximately 120° C.

Silicon dioxide ($SiO_2$) was deposited as a gate insulating film 6. The sputtering method was used as a deposition means and deposition was performed at a room temperature as the substrate temperature. Sputtering was made to obtain a film thickness of approximately 100 nm at a power of 300 W, in an atmosphere of Ar gas of 13 sccm and $O_2$ gas of 1.2 sccm and at a pressure of 0.187 Pa.

Incidentally, the sputtering apparatus is equipped with a load lock and a water vapor partial pressure is suppressed in the deposition chamber.

An In—Ga—Zn—O based oxide semiconductor was deposited as an active layer 5. The composition ratio of In:Ga:Zn:O is 1:1:1:4 and film thickness is approximately 40 nm. After the active layer was patterned by a photolithography method and it was deposited by the sputtering method used as a deposition means at a room temperature as the substrate temperature. The In—Ga—Zn—O based oxide semiconductor with the composition ratio of In:Ga:Zn:O is 1:1:1:4 was used as a target. The sputtering was conducted at a substrate bias of −10 V and a power of 200 W, in an atmosphere of Ar/$O_2$ partial pressure ratio of 3% and at a pressure of 0.5 Pa. Aside from the above example, the thin film deposited under the same conditions was measured with thin film X-ray diffraction (at an incident angle of 0.5 degrees). No clear diffraction peak was observed, and therefore the produced In—Ga—Zn—O based thin film is considered to be amorphous. The content of moisture in another single film produced under the same conditions was examined by the TPD method, as a result, desorption gas observed as a water molecule was 1.4/$nm^3$, and it was confirmed that the moisture content in the film was 1.4/$nm^3$. The amount of desorption gas by the TPD analysis is an integrated value of desorption gas with respect to each substrate temperature (same as the second embodiment and the first comparative example).

A source electrode 3 and a drain electrode 4 were patterned by a resist using the photolithography method. In the present embodiment, gold (Au) was used in the source and the drain electrode and deposited to a thickness of approximately 40 nm by the vacuum vapor deposition method and both electrodes were formed by a lift off method.

As a result of measuring the characteristics, a mobility was 3.70 $cm^2$/V·s and an on/off ratio was 5.2×$10^6$.

Second Embodiment

Figure 4:
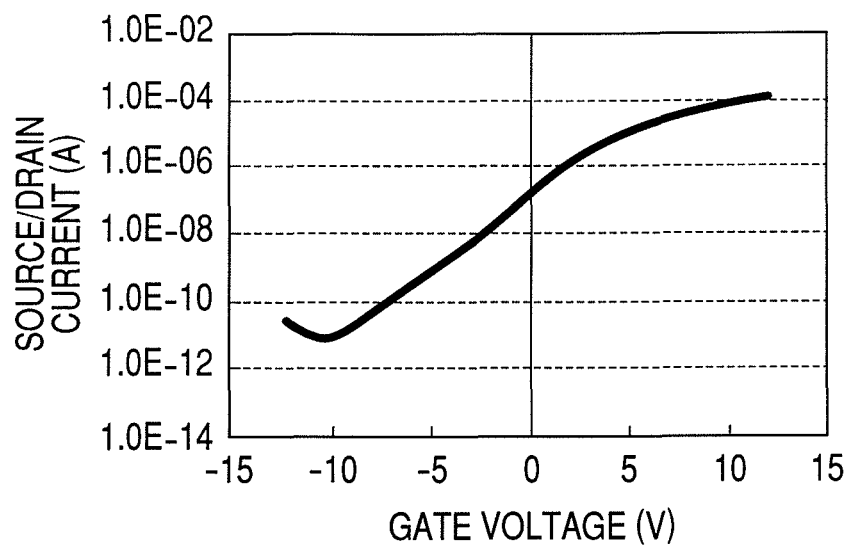
FIG. 4 is a chart illustrating the drain/source current with respect to the gate voltage of the bottom gate thin film transistor according to a second embodiment of the present invention.
Figure 5:
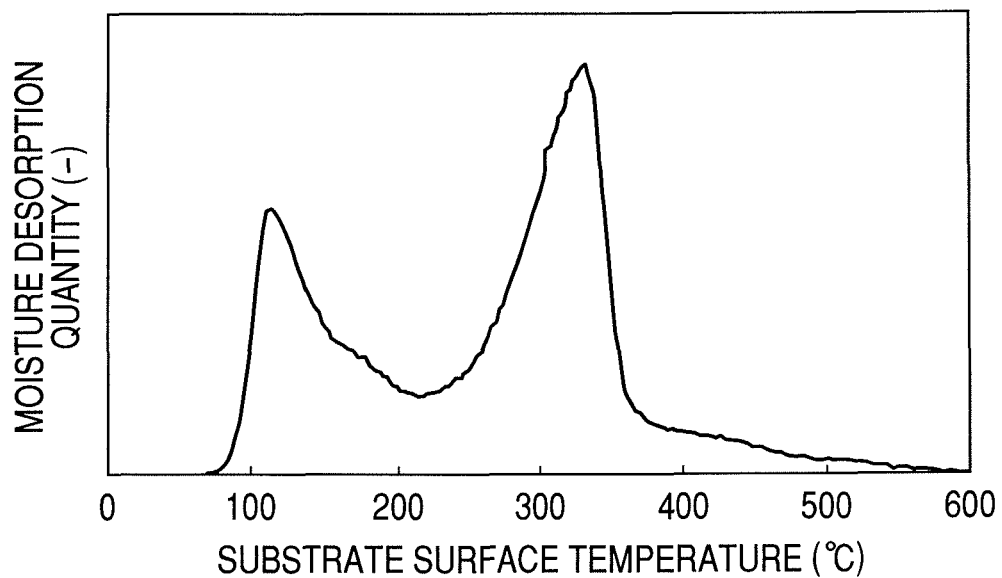
FIG. 5 is a chart illustrating results of TPD measurement on an active layer according to the second embodiment of the present invention.

The second embodiment of the present invention is described below based on FIGS. 4 and 5. FIG. 4 is a chart illustrating the drain/source current with respect to the gate voltage of the bottom gate thin film transistor according to the second embodiment of the present invention. FIG. 5 is a chart illustrating results of TPD measurement on an active layer according to the second embodiment of the present invention.

Three months after the first embodiment, at the time when the moisture contained in the target of the sputtering apparatus is considered to be reduced, an In—Ga—Zn—O based thin film transistor was produced. During this period, the pressure of the deposition chamber in its non-operation mode was approximately $10^{-5}$ Pa.

The same deposition conditions and procedures as those of the first embodiment were used. Aside from the above example, the thin film deposited under the same conditions was measured with thin film X-ray diffraction (at an incident angle of 0.5 degrees). No clear diffraction peak was observed, therefore the produced In—Ga—Zn—O based thin film is considered to be amorphous. The content of moisture in another single film produced under the same conditions was examined by the TPD method, as a result, it was confirmed that the moisture content in the film was 1.0/$nm^3$.

As a result of measuring the characteristics of completed thin film transistor, a mobility was 5.05 $cm^2$/V·s and an on/off ratio was 4.4×$10^6$.

As illustrated in the result of TPD measurement on the active layer in FIG. 5, the moisture desorption quantity is smaller at a temperature of approximately 100° C. than that in the result of TPD measurement on the active layer in FIG. 2. This is because the sample of a single film being held in a vacuum in the TPD apparatus desorbs moisture absorbed mainly on the surface of the film.

First Comparative Example

Figure 6:
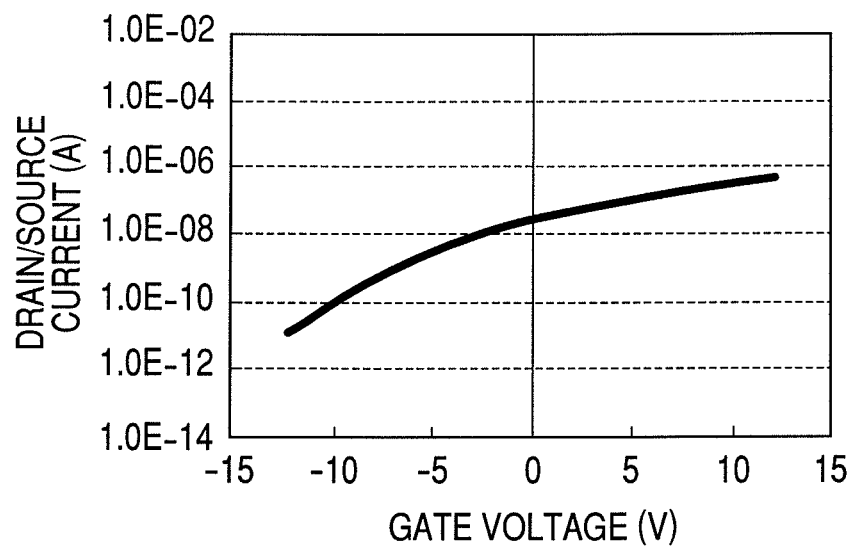
FIG. 6 is a chart illustrating the drain/source current with respect to the gate voltage of the bottom gate thin film transistor according to a first comparison example of the present invention.
Figure 7:
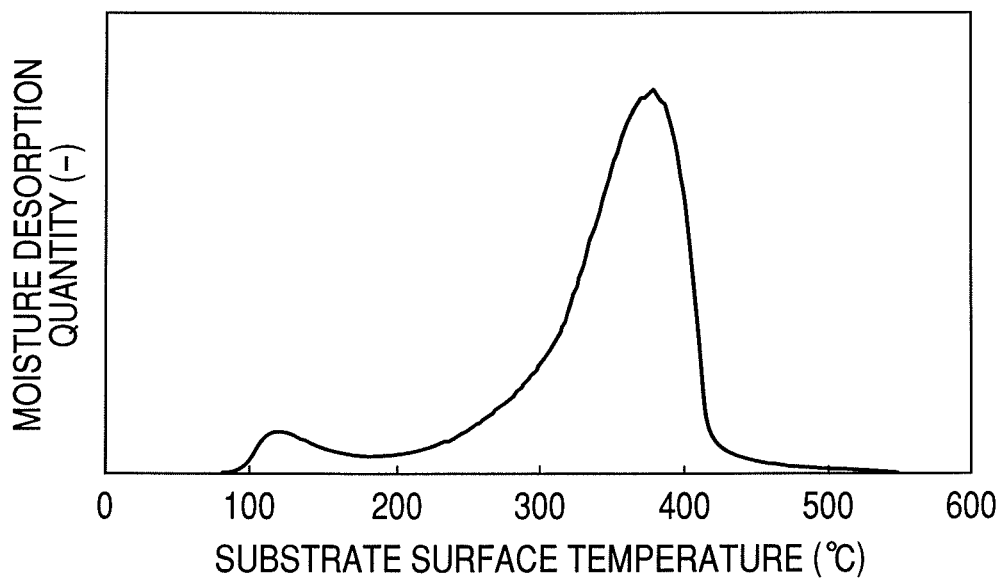
FIG. 7 is a chart illustrating results of TPD measurement on an active layer according to the first comparison example of the present invention.

The first comparative example of the present invention is described below with reference to FIGS. 6 and 7. FIG. 6 is a chart illustrating the drain/source current with respect to the gate voltage of the bottom gate thin film transistor according to a first comparison example of the present invention. FIG. 7 is a chart illustrating results of TPD measurement on an active layer according to the first comparison example of the present invention.

An In—Ga—Zn—O based thin film transistor was produced without the use of the load lock of the sputtering apparatus at the time when a water vapor partial pressure in the deposition chamber is considered to be higher than that in the first embodiment. The same deposition conditions and procedures as those of the first embodiment were used. Aside from the above example, the thin film deposited under the same conditions was measured with thin film X-ray diffraction (at an incident angle of 0.5 degrees). No clear diffraction peak was observed, therefore the produced In—Ga—Zn—O based thin film is considered to be amorphous. The content of moisture in another single film produced under the same conditions was examined by the TPD method, as a result, it was confirmed that the moisture content in the film was 4.7/$nm^3$.

Incidentally, the moisture desorption quantity indicated by the ordinate in FIGS. 2, 5 and 7 is not shown based on the common criterion in FIGS. 2, 5 and 7. In other words, FIGS. 2, 5 and 7 illustrate the tendency in variation of the moisture desorption quantity with respect to the substrate surface temperature. Therefore, the values of the moisture desorption quantity cannot be compared with one another.

As a result of measuring the characteristics of completed thin film transistor, mobility was 0.04 $cm^2$/V·s and on/off ratio was 3.9×$10^4$.

Table 1 lists the characteristics of the thin film transistors in the first and the second embodiment and the first comparative example. Table 1 shows the characteristics of the thin film transistors in the embodiments and the comparative example of the present invention.

TABLE 1

|  | Embodiment 1 | Embodiment 2 | Comparative example 1 |
| --- | --- | --- | --- |
| Mobility (cm²/Vs) | 3.70 | 5.05 | 0.04 |
| On/Off | $5.2 \times 10^5$ | $4.4 \times 10^5$ | $3.9 \times 10^4$ |

In the first embodiment, the active layer contains a water molecule of $1.4/nm^3$ and has a mobility of 3.70 cm²/V·s which is very much higher than that of the amorphous Si. The on/off ratio thereof is $5.2 \times 10^6$ which is a sufficient switching characteristic. In the second embodiment, the active layer contains a water molecule of $1.0/nm^3$ which is smaller than that of the first embodiment, but a mobility of 5.05 cm²/V·s which is higher than that of the first embodiment. The on/off ratio thereof is $4.4 \times 10^6$ which is a sufficient switching characteristic. In the first comparative example, the active layer contains a water molecule of $4.7/nm^3$ which is larger than that of the first embodiment, but a mobility of 0.04 cm²/V·s which is significantly smaller than that of the first embodiment. The on/off ratio thereof is $3.9 \times 10^4$ which is also significantly smaller than that of the first embodiment. From these results, the water molecule contained in the active layer is preferably $1.4/nm^3$ or less and it is preferably fewer and idealistically $0/nm^3$.

Third Embodiment

The insulated gate type transistor of the present invention is described above. The connection of the electrode of a display element to a drain being the output terminal of the insulated gate type transistor enables the display device to be formed. As the display element there can be used an organic or inorganic electro-luminescence element (EL element) or a liquid crystal element or the like. The configured embodiment of a concrete display device is described below with reference to the cross section of the display device. A top-gate transistor is exemplified herein.

Figure 8:
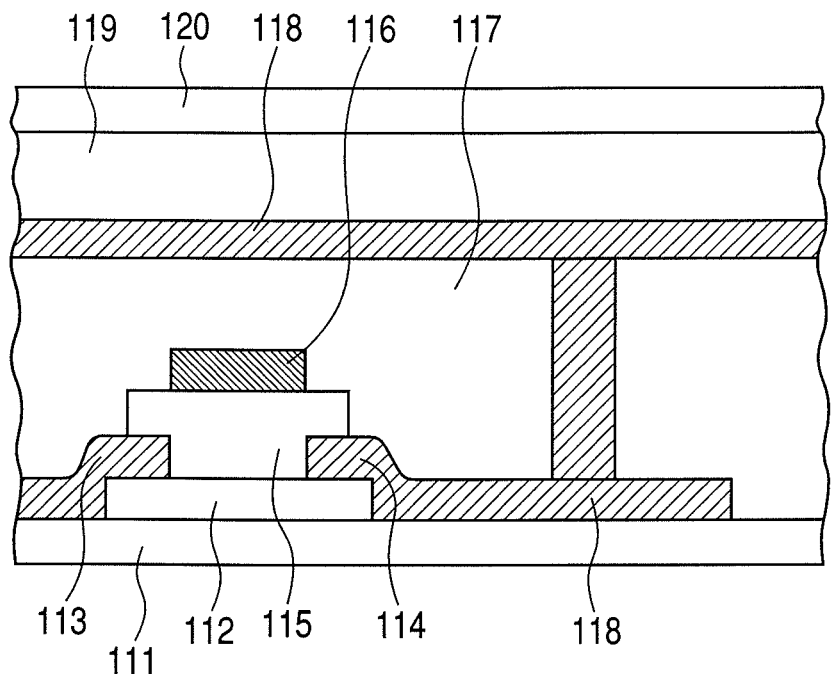
FIG. 8 is a cross-section of one example of a display device according to the present invention.

As illustrate in FIG. 8, a TFT composed of an amorphous oxide semiconductor film 112, a source electrode 113, a drain electrode 114, a gate insulating film 115 and a gate electrode 116 is formed on a substrate 111. An electrode 118 is connected to the drain electrode 114 through an interlayer insulating film 117 and the electrode 118 is in contact with a light-emitting layer 119 which in contact with an electrode 120. Such a configuration enables a current injected into the light-emitting layer 119 to be controlled by the value of a current flowing from the source electrode 113 to the drain electrode 114 through a channel formed on the amorphous oxide semiconductor film 112. Therefore, this current can be controlled by the voltage of the gate 116 of the TFT. The electrode 118, the light-emitting layer 119 and the electrode 120 form an organic or an inorganic electro-luminescence element (EL element).

Figure 9:
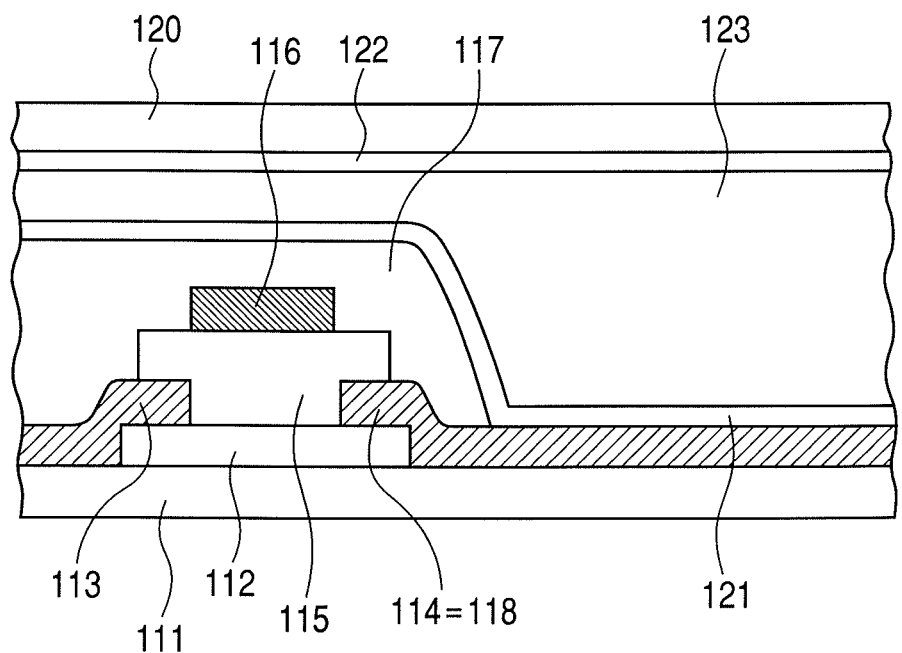
FIG. 9 is a cross-section of another example of a display device according to the present invention.

Alternatively, as illustrated in FIG. 9, a display device may be formed such that a drain electrode 114 is extended to be functioned also as an electrode 118 which applies voltage to a liquid crystal cell or an electrophoretic particle cell 123 sandwiched between high resistance films 121 and 122. The liquid crystal cell or the electrophoretic particle cell 123, the high resistance layers 121 and 122, and the electrodes 118 and 120 form a display element. A voltage applied to such a display element can be controlled by the value of a current flowing from the source electrode 113 to the drain electrode 114 through a channel formed on the amorphous oxide semiconductor film 112. Therefore, this current can be controlled by the voltage of a gate electrode 116 of the TFT. If the display medium of the display element is a capsule in which fluid and particle are sealed in an insulating film, the high resistance films 121 and 122 are not required.

Although the above two examples of the TFTs are typified by top gate coplanar TFT structure, the present embodiment is not limited to this configuration. Other configurations, for example, a stagger TFT, are available.

Although the above two examples provide a pair of electrodes for driving the display element in parallel with the substrate, but the present embodiment is not limited to this configuration. Either or both of the electrodes may also be provided, for example, perpendicular to the substrate.

Although the above two examples illustrate only one TFT connected to the display element, but the present embodiment is not limited to this configuration. For example, the TFT illustrated in the figure may be connected to another TFT according to the present embodiment, and the TFT in the figure may be situated in the final stage of the circuit by such other TFT.

In the case where a pair of electrodes for driving the display element is provided in parallel with the substrate, if the display element is an EL element or a reflecting display element such as a reflecting liquid crystal element, either of the electrodes needs to be transparent the light-emitting wavelength or the wavelength of the reflected light. If the display element is a transmission display element such as a transmission liquid crystal element, both electrodes need to be transparent to the transmitted beam.

In the TFT of the present embodiment, all components are enabled to be transparent, thereby allowing a transparent display element to be formed. Such a display element can be provided on a low heat-resisting substrate such as a resin plastic substrate which is lightweight and flexible.

A display device in which a plurality of pixels each including an EL element (an organic EL element herein) and thin film transistors are arranged two-dimensionally on the substrate is described with reference to FIG. 10.

Figure 10:
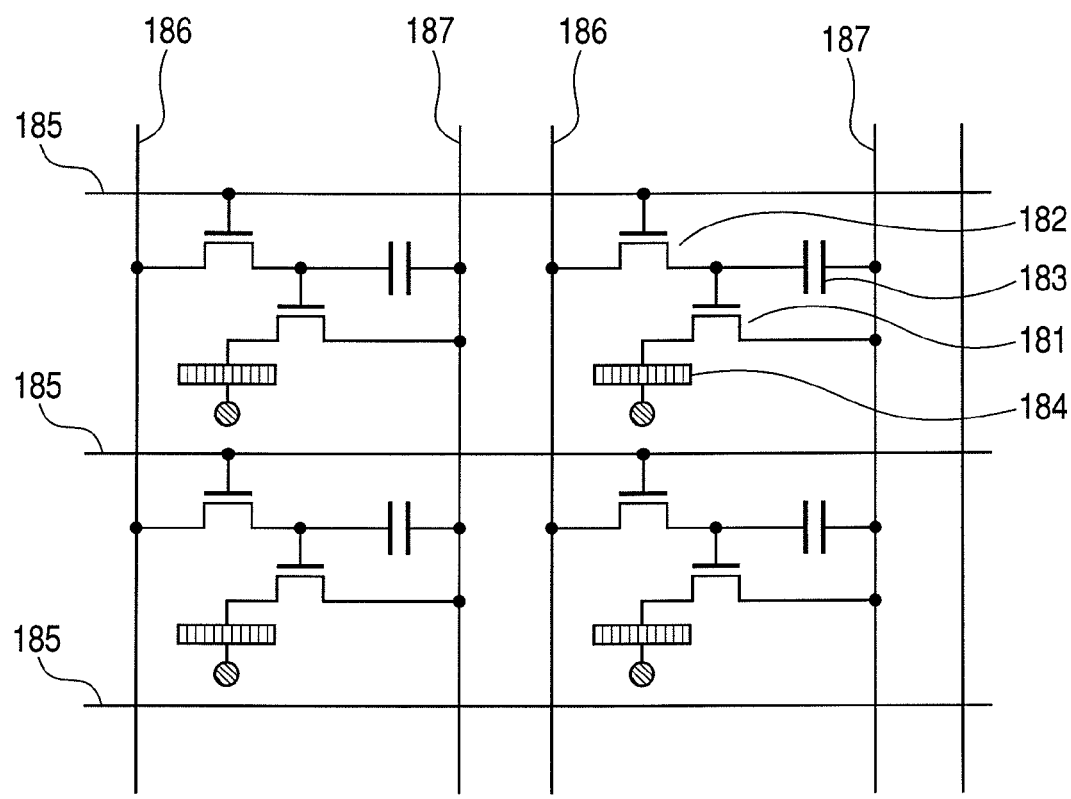
FIG. 10 is a schematic diagram illustrating the configuration of a display device in which pixels including organic EL elements and thin film transistors are two-dimensionally arranged.

In FIG. 10, a transistor 181 drives an organic EL layer 184 and a transistor 182 selects a pixel. A capacitor 183 holds a selected state, stores electric charges between a common electrode wire 187 and the source part of the transistor 182 and holds the signal of the gate of the transistor 181. A scanning electrode wire 185 and a signal electrode wire 186 determine the selection of pixels.

More specifically, a pulsed image signal is applied from a driver circuit (not shown) to the gate electrode through the scanning electrode 185. At the same time, a pulsed image signal is applied from another driver circuit (not shown) to the transistor 182 through the signal electrode 186 to select pixels. Then, the transistor 182 is turned on to store electric charges in the capacitor 183 between the signal electrode wire 186 and the source of the transistor 182. This keeps the gate voltage of the transistor 181 at a desired voltage to turn on the transistor 181. This state is kept until the next signal is received. While the transistor 181 is being turned on, the supply of voltage and current is continued to the organic EL layer 184 to maintain light emission.

Although one pixel includes two transistors and one capacitor in the example of FIG. 10, it may include more transistors to improve its performance. What is essential is that the transparent In—Ga—Zn—O based TFT which can be formed in the transistor part at a low temperature according to the present embodiment is used to provide an effective EL element.

This application claims the benefit of Japanese Patent Application No. 2007-126860, filed May 11, 2007, which is hereby incorporated by reference herein in its entirety.

What is claimed is:

1. A manufacturing method of a transistor that comprises an active layer of an oxide semiconductor containing In—Ga—Zn—O, the method comprising:

forming the active layer of the oxide semiconductor while controlling water vapor partial pressure in a deposition chamber so that the active layer contains a water molecule content of $1.4/nm^3$ or less.

2. The manufacturing method according to claim 1, wherein the active layer is amorphous.

* * * * *